(12) United States Patent
Gammel et al.

(10) Patent No.: US 7,721,177 B2
(45) Date of Patent: May 18, 2010

(54) DEVICE AND METHOD FOR DETERMINING A POSITION OF A BIT ERROR IN A BIT SEQUENCE

(75) Inventors: Berndt Gammel, Markt Schwaben (DE); Rainer Goettfert, Taufkirchen (DE); Oliver Kniffler, Munich (DE)

(73) Assignee: Infineon Technologies AG, Neubiberg (DE)

( * ) Notice: Subject to any disclaimer, the term of this patent is extended or adjusted under 35 U.S.C. 154(b) by 1041 days.

(21) Appl. No.: 11/383,143

(22) Filed: May 12, 2006

(65) Prior Publication Data

US 2006/0282756 A1   Dec. 14, 2006

(30) Foreign Application Priority Data

May 12, 2005   (DE) ........................ 10 2005 022 107

(51) Int. Cl.
*H03M 13/00* (2006.01)
(52) U.S. Cl. ........................ 714/752; 714/758
(58) Field of Classification Search ................. 714/752, 714/757, 758, 801
See application file for complete search history.

(56) References Cited

U.S. PATENT DOCUMENTS

| 4,464,753 | A | * | 8/1984 | Chen | ........................... 714/765 |
| 5,099,483 | A |   | 3/1992 | Kadokawa | |
| 5,535,227 | A | * | 7/1996 | Silvano | ....................... 714/766 |
| 5,841,795 | A | * | 11/1998 | Olarig et al. | ................. 714/768 |
| 7,051,264 | B2 | * | 5/2006 | Leung et al. | ................. 714/763 |
| 7,487,425 | B1 | * | 2/2009 | Chen | ........................... 714/752 |

FOREIGN PATENT DOCUMENTS

EP   1 449 082 B1   4/2006

OTHER PUBLICATIONS

Chen et al., IBM J. Res. Develop., vol. 28, No. 2, pp. 124-134 (1984).
M.Y. Hsiao, IBJ J. Res. Develop., pp. 395-401 (1970).

* cited by examiner

*Primary Examiner*—Sam Rizk
(74) *Attorney, Agent, or Firm*—Dickstein, Shapiro, LLP.

(57) ABSTRACT

In a device for determining a position of a bit error in a bit sequence, a check matrix is used which has a predefined number of rows and a predefined number of columns. The check matrix includes a plurality of square submatrices having a submatrix row number and a submatrix column number corresponding to the predefined number of rows or the predefined number of columns of the check matrix. The device for determining then includes a unit for receiving a bit sequence and a unit for identifying a syndrome using the check matrix and the received bit sequence. Furthermore, the device includes a unit for establishing a position of a bit error in the received bit sequence, wherein the unit for establishing is adapted to identify a syndrome bit and a syndrome bit group in the syndrome, and wherein the unit for establishing is further adapted to determine the position of the bit error in the received bit sequence using information on a position of the syndrome bit or the syndrome bit group in the syndrome, information on a relationship between the syndrome bit and the syndrome bit group, and a submatrix row number or a submatrix column number of a submatrix.

13 Claims, 3 Drawing Sheets

| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 | 37 | 38 | 39 | 40 |
|---|---|---|---|---|---|---|---|---|---|---|---|---|---|---|---|---|---|---|---|---|---|---|---|---|---|---|---|---|---|---|---|---|---|---|---|---|---|---|---|---|
| 1 | 1 | | | | | | 1 | | | | 1 | | | | | | 1 | | | | 1 | | | | | 1 | | | | | 1 | | | | | 1 | | | | 1 |
| 2 | | | 1 | | | | | 1 | | 1 | | | 1 | | | | | 1 | | 1 | | 1 | | | | | 1 | | | 1 | | | 1 | | | | 1 | | 1 | |
| 3 | 1 | | | | | 1 | | 1 | | | | 1 | | 1 | | 1 | | | 1 | | | | 1 | | 1 | | | 1 | | | 1 | | 1 | | | | 1 | | | |
| 4 | | | 1 | | 1 | | 1 | | 1 | | | 1 | | | 1 | | 1 | | | | | 1 | | 1 | | | 1 | | 1 | | | | | 1 | | 1 | | | | |
| 5 | 1 | | | 1 | | 1 | | | | 1 | 1 | | | 1 | | 1 | | | | 1 | | | 1 | | 1 | | 1 | | | | | 1 | | | 1 | | | 1 | | |
| 6 | | 1 | | 1 | | 1 | | | 1 | | | 1 | | 1 | | | 1 | | 1 | | | 1 | | | | 1 | | 1 | | 1 | | | 1 | | | | | | 1 | |
| 7 | | 1 | 1 | | 1 | | | 1 | | | 1 | | 1 | | | 1 | | 1 | | | 1 | | 1 | | | 1 | | | 1 | | 1 | | | 1 | | | 1 | | | |
| 8 | | | | 1 | | 1 | 1 | | | | | 1 | | 1 | 1 | | | | 1 | 1 | | | 1 | 1 | | | | 1 | 1 | | | | 1 | | | 1 | | 1 | | |
| 9 | | | 1 | | 1 | 1 | | | | 1 | | 1 | | | 1 | 1 | | | 1 | | | 1 | 1 | | | | 1 | 1 | | | | 1 | 1 | | | | 1 | | | |
| 10 | | | | | | | | 1 | 1 | | | | | | | 1 | 1 | | | | 1 | | | | 1 | | | | | 1 | | | | | 1 | | | | | 1 |

H₂

DEVICE AND METHOD FOR DETERMINING A POSITION OF A BIT ERROR IN A BIT SEQUENCE

CROSS-REFERENCE TO RELATED APPLICATION

This application claims priority from German Patent Application No. 10 2005 022 107.6, which was filed on May 12, 2005, and is incorporated herein by reference in its entirety.

BACKGROUND OF THE INVENTION

1. Field of the Invention

The present invention relates to the technical field of electrical engineering, and the present invention relates particularly to a device and a method for determining a position of a bit error in a bit sequence.

2. Description of the Related Art

Errors occurring when transmitting data or storing data should be corrected as far as possible. Often errors can be assumed to occur rather infrequently. In this case, it is useful to implement a coding algorithm that is able to correct a maximum number of single bit errors in a specific data unit.

The problem of the single bit error correctability is usually solved by the implementation of a suitable coding algorithm. Mostly, linear codes are used for that. They can be implemented in hardware in a particularly convenient manner.

In a systematic code, k information bits $a_1 a_2 \ldots a_k$ are complemented by n−k check bits $a_{k+1} a_{k+2} \ldots a_n$ to generate a code word $c = a_1 a_2 \ldots a_n$ of the length n. This yields $$c = \underbrace{a_1 a_2 a_3 \ldots a_k}_{\text{information bits}} \underbrace{a_{k+1} a_{k+2} \ldots a_n}_{\text{check bits}}.$$

The set C of all code words is a subspace of $F_2^n$, wherein $F_2 = \{0,1\}$ defines the binary field. If $C \subseteq F_2^n$ is a linear subspace of $F_2^n$ with the dimension k, this is referred to as a (binary systematic) linear (n,k) code. Here, only the binary codes will be discussed. Particular attention will be paid to codes in which n and k are arbitrary. For illustrative reasons, an exemplary linear (n,k) code with n=7 and k=4 is used.

A linear (n,k) code can be described unambiguously by its parity check matrix H. The parity check matrix H is a binary (n−k)×n matrix of the rank n−k. It has the form $H = (A, I_{n-k})$, wherein $I_{n-k}$ denotes the (n−k)×(n−k) unit matrix. The unit matrix has ones in the main diagonal and otherwise zeroes. The row vector $C \in F_2^n$ is a code word when, and only when, equation (1)

$$Hc^T = 0 \tag{1}$$

applies. Here $c^T$ represents the transpose of c. If c is a row vector, then $c^T$ is a column vector.

In the following, the common nomenclature is adopted. If $v = (v_0, v_1, \ldots, v_{n-1})$ is a row vector, then the transpose $v^T$ of v represents the corresponding column vector $$v^T = \begin{pmatrix} v_0 \\ v_1 \\ \vdots \\ v_{n-1} \end{pmatrix}$$

In this context, $v \in F_2^n$ and $v^T \in F_2^n$. Furthermore, if A is an m×n matrix, then the transpose of A, indicated by $A^T$, is the n×m matrix whose $j^{th}$ column is the transpose of the j-row of A for $1 \leq j \leq m$. For example, if $$A = \begin{pmatrix} 110 \\ 011 \end{pmatrix}, \text{ then } A^T = \begin{pmatrix} 10 \\ 11 \\ 01 \end{pmatrix}$$

Furthermore, this description uses the sign "+" as an indication of an XOR operation. This means that 0+0=0, 0+1=1, 1+0=1 and 1+1=0.

As an example, a linear (7,4) code is used which is characterized by its parity check matrix in equation (2)

$$H = \begin{pmatrix} 1011 & 100 \\ 1101 & 010 \\ 1110 & 001 \end{pmatrix} \tag{2}$$

It is to be noted here that the first four columns of H are formed by the matrix A, whereas the last three columns are formed by the unit matrix $I_3$. $c=(1,1,0,0,1,0,0)$ can be shown to be a code word, because $Hc^T = (0,0,0)^T$ yields the zero vector.

The coding of a linear code can be performed as follows. If $H = (A, I_{n-k})$ is the parity check matrix of a binary linear (n,k) code, then the k×n matrix $$G = (I_k, A^T)$$

is referred to as canonical generator matrix of the code. The coding of a message $a = a_1 a_2 \ldots a_k$ into the corresponding code word $c = a_1 a_2 \ldots a_k a_{k+1} \ldots a_n$ is realized via a matrix multiplication $$aG = c$$

Equivalently also:

$$\underbrace{a_1 a_2 \ldots a_k}_{\text{information bits}} A^T = \underbrace{a_{k+1} \ldots a_n}_{\text{check bits}}.$$

Based on the continued example, this will be explained in more detail. For the parity check matrix H from equation (2), the corresponding 4×7 matrix $$G = \begin{pmatrix} 1000 & 111 \\ 0100 & 011 \\ 0010 & 101 \\ 0001 & 110 \end{pmatrix}$$

may be identified as corresponding generator matrix.

The message $(a_1, a_2, a_3, a_4) \in F_2^4$ is coded into the code word c by $$c=(a_1,a_2,a_3,a_4)G=(a_1,a_2,a_3,a_4,a_1+a_3+a_4,a_1+a_2+a_3,a_1+a_2+a_3)$$

Equivalently, given the information bits $a_1 a_2 a_3 a_4$, the corresponding check bits may be calculated according to $$\underbrace{(a_1, a_2, a_3, a_4)}_{\text{information bits}} \begin{pmatrix} 111 \\ 011 \\ 101 \\ 110 \end{pmatrix} = \underbrace{(a_1 + a_3 + a_4, a_1 + a_2 + a_4, a_1 + a_2 + a_3)}_{\text{check bits}}$$

It is to be noted here that the parity check matrix H from equation (2) has the same number of ones in each of its three rows. This feature is desirable for an efficient hardware implementation of the coding scheme. This is due to the fact that the calculation of each of the n−k check bits requires the same number of XOR operations (i. e. has the same logical depth). Another desirable property is that H is "sparsely occupied". A binary matrix is called "sparsely occupied" when it contains relatively few ones. Furthermore, the decoding can be described as follows, wherein x and y represent two binary vectors. The Hamming distance d(x, y) between x and y is the number of coordinates in which x and x differ. The Hamming weight w(x) of x is the number of coordinates of x that are not zero.

Obviously therefore w(x)=d(x,0) and d(x,y)=w(x−y). For example, if x=(0,1,0,0,0,1), then w(x)=2.

Definition. Let C be a code. The number $$d = \min_{\substack{u,v \in C \\ u \neq v}} d(u, v)$$

is called minimum distance of C.

Lemma 1. The minimum distance of a linear code C is the smallest Hamming weight from all non-zero code words. This results in $$d = \min_{0 \neq c \in C} w(c)$$

Theorem 1. If H is the parity check matrix of a linear code, then the code has the minimum distance d when, and only when, all d−1 columns of H are linearly independent and some d columns are linearly dependent. In other words, the minimum distance d equals the smallest number of columns of H summing up to 0.

At this point, the above example is continued: consider the parity check matrix H from equation (2). Any three columns of H are linearly independent, whereas four columns have to be linearly dependent. In this way, the associated linear code has a minimum distance of d=4.

Theorem 2. A linear code with even minimum distance d can simultaneously correct (d−2)/2 errors and detect d/2 errors.

Assume that a message $a \in F_2^k$ is coded into a code word $c \in F_2^n$, which is then transmitted via a disturbed channel (or is stored in a memory). The vector $y \in F_2^n$ is received. If, during transmission (or storage), there are less than $\lfloor (d-1)/2 \rfloor$ errors, then the correct code word c may be reconstructed from y. At this point, the so-called syndrome of y becomes helpful.

Definition. Let H be the parity check matrix of a linear (n,k) code C. Then the column vector $S(y)=Hy^T$ of the length n−k is called syndrome of $y \in F_2^n$.

By the definition of the parity check matrix H (cf. equation (1)), $y \in F_2^n$ is a code word when, and only when, S(y) is the zero vector.

Theorem 3. For a binary code, the syndrome equals the sum of the columns of H in which the errors have occurred.

Thereby S(y) is called syndrome, because it gives the symptoms of errors.

Especially the single error correction will be discussed. In this case, the above theorem assumes a simple form:

Theorem 4. A single bit error occurs when, and only when, the syndrome equals a column of H. The position of this column corresponds to the error position.

This is again demonstrated by means of the continued example: again consider the linear (7,4) code defined by the parity check matrix $$H = \begin{pmatrix} 1011 & 100 \\ 1101 & 010 \\ 1110 & 001 \end{pmatrix}$$

Assume that the vector y=(1,0,1,0,0,0,1) is received. The syndrome is calculated as follows:

$$S(y) = Hy^T = \begin{pmatrix} 0 \\ 1 \\ 1 \end{pmatrix}$$

The syndrome S(y) matches the second column vector of H and thus indicates that the second coordinate of y is defective. This allows to identify the correct code word c=(1,1,1,0,0,0, 1) and the information bits to 1110.

The most direct and also most hardware-saving implementation of a linear code is realized by means of the so-called check matrix (parity check matrix) of the code. The matrix entries are bits. For a single bit error correction, it is possible to structure the matrix so that each column of the matrix contains, for example, exactly three ones and otherwise zeroes. One exception are only the last columns of the check matrix, which preferably form a unit matrix and only need to contain one 1, respectively.

However, the conventional approaches of the single bit error correction have the disadvantage that, with the help of the syndrome and the check matrix, there has to be a comparison as to which column of the check matrix matches the syndrome in order to be able to determine the position of the occurred bit error therefrom.

SUMMARY OF THE INVENTION

It is the object of the present invention to provide a scheme allowing to determine the position of a bit error in a received bit sequence in a simpler way, i.e. more efficient with respect to hardware and/or numerically simpler, as compared to prior art.

In accordance with a first aspect, the present invention provides a device for determining a position of a bit error in a bit sequence using a check matrix, wherein the check matrix has a predefined number of rows and a predefined number of columns, wherein the check matrix includes a plurality of square submatrices having a submatrix row number and a submatrix column number, wherein the submatrix row number corresponds to the predefined number of rows or the submatrix column number corresponds to the predefined number of columns of the check matrix, wherein each submatrix includes submatrix entries arranged circularly with respect to a first submatrix row or a first submatrix column, wherein a bit and a bit group are arranged in each submatrix row or in each submatrix column, and wherein, in a first submatrix, the bit and the bit group are arranged in a first predetermined relationship to each other and, in a second submatrix, the bit and the bit group are arranged in a second predetermined relationship to each other, wherein the first predetermined relationship differs from the second predetermined relationship, and wherein the device for determining has a unit for receiving a bit sequence; a unit for identifying a syndrome using the check matrix and the received bit sequence; and a unit for establishing a position of a bit error in the received bit sequence, wherein the unit for establishing is adapted to identify a syndrome bit and a syndrome bit group in the syndrome, and wherein the unit for establishing is further adapted to determine the position of the bit error of the received bit sequence using information on a position of the syndrome bit or the syndrome bit group in the syndrome, information on a relationship between the syndrome bit and the syndrome bit group and the submatrix row number or the submatrix column number.

In accordance with a second aspect, the present invention provides a method for determining a position of a bit error in a bit sequence using a check matrix, wherein the check matrix has a predefined number of rows and a predefined number of columns, wherein the check matrix includes a plurality of square submatrices having a submatrix row number and a submatrix column number, wherein the submatrix row number corresponds to the predefined number of rows or the submatrix column number corresponds to the predefined number of columns of the check matrix, wherein each submatrix includes submatrix entries arranged circularly with respect to a first submatrix row or a first submatrix column, wherein a bit and a bit group are arranged in each submatrix row or in each submatrix column, and wherein, in a first submatrix, the bit and the bit group are arranged in a first predetermined relationship to each other and, in a second submatrix, the bit and the bit group are arranged in a second predetermined relationship to each other, wherein the first predetermined relationship differs from the second predetermined relationship, and wherein the method for determining has the steps of receiving a bit sequence; identifying a syndrome using the check matrix and the received bit sequence; and establishing a position of a bit error in the received bit sequence such that a syndrome bit and a syndrome bit group are identified in the syndrome to determine the position of the bit error of the received bit sequence using information on a position of the syndrome bit or the syndrome bit group in the syndrome, information on a relationship between the syndrome bit and the syndrome bit group and the submatrix row number or the submatrix column number.

In accordance with a third aspect, the present invention provides a device for providing a check matrix for identifying a position of a bit error in a bit sequence, having a unit for determining a first square submatrix, wherein the first square submatrix has a bit and a bit group either in each submatrix row or in each submatrix column, wherein the first square submatrix includes submatrix entries arranged circularly with respect to a first submatrix row or a first submatrix column, and wherein the bit and the bit group are arranged in a first predetermined relationship to each other; a unit for identifying a square second submatrix, wherein the second square submatrix has a bit and a bit group in each submatrix row or in each submatrix column, wherein the second submatrix includes submatrix entries arranged circularly with respect to a first submatrix row or a first submatrix column, and wherein the bit and the bit group are arranged in a second predetermined relationship to each other, wherein the first predetermined relationship differs from the second predetermined relationship; and a unit for combining the first and the second square submatrix to a check matrix, wherein the check matrix includes a number of rows corresponding to a submatrix row number of the first or the second submatrix, or wherein the check matrix includes a number of columns corresponding to a submatrix column number of the first or the second square submatrix.

In accordance with a fourth aspect, the present invention provides a method for providing a check matrix for identifying a position of a bit error in a bit sequence, having the steps of determining a first square submatrix such that the first submatrix has a bit and a bit group either in each submatrix row or in each submatrix column, wherein the first square submatrix includes submatrix entries arranged circularly with respect to a first submatrix row or a first submatrix column, and wherein the bit and the bit group are arranged in a first predetermined relationship to each other; identifying a square second submatrix such that the second submatrix has a bit and a bit group either in each submatrix row or in each submatrix column, wherein the second square submatrix includes submatrix entries arranged circularly with respect to a first submatrix row or a first submatrix column, and wherein the bit and the bit group are arranged in a second predetermined relationship to each other, wherein the first predetermined relationship differs from the second predetermined relationship; and combining the first and the second square submatrix to a check matrix, wherein the check matrix includes a number of rows corresponding to a submatrix row number of the first or the second square submatrix, or wherein the check matrix includes a number of columns corresponding to a submatrix column number of the first or the second square submatrix.

In accordance with a fifth aspect, the present invention provides a check matrix for determining a positon of a bit error in a bit sequence, having a first square submatrix having a bit and a bit group either in each submatrix row or in each submatrix column, wherein the first square submatrix includes submatrix entries arranged circularly with respect to a first submatrix row or a first submatrix column, and wherein the bit and the bit group are arranged in a first predetermined relationship to each other; a second square submatrix having a bit and a bit group either in each submatrix row or in each submatrix column, wherein the second square submatrix includes submatrix entries arranged circularly with respect to a first submatrix row or a first submatrix column, and wherein the bit and the bit group are arranged in a second predetermined relationship to each other, wherein the first predetermined relationship differs from the second predetermined relationship; and wherein the first square submatrix and the second square submatrix are arranged in the check matrix such that the check matrix has a number of rows corresponding to a submatrix row number of the first or the second square submatrix, or that the check matrix has a number of columns corresponding to a submatrix column number of the first or the second square submatrix.

In accordance with a sixth aspect, the present invention provides a computer program with program code for performing the above-mentioned method for determining a position of a bit error in a bit sequence using a check matrix, when the computer program runs on a computer.

In accordance with a seventh aspect, the present invention provides a computer program with program code for performing the above-mentioned method for providing a check matrix for identifying a position of a bit error in a bit sequence, when the computer program runs on a computer.

The present invention is based on the finding that, by a special design of the check matrix, the position of a bit error that has occurred in a bit sequence may be calculated already from an arrangement of bits and/or bit groups in the syndrome without finding out the column or row of the check matrix matching the syndrome by a comparison of the syndrome with the check matrix comprising a numerical and/or hardware effort. If the check matrix is designed such that the determination of the bit error and/or the bit error position in the bit sequence may already be detected from the syndrome, this bit error position may be determined, for example, by applying a simple formula including a multiplication and an addition. The position of a syndrome bit and/or of a first bit of a syndrome bit group, information on a relationship between the syndrome bit and the syndrome bit group and information on a submatrix column number and a submatrix row number are preferably to be used for this.

The present invention offers the advantage that now a numerically large effort or a large hardware effort is no longer necessary to establish which column of the check matrix matches the syndrome to identify the position of the bit error in a received bit sequence therefrom. Rather, merely by knowing the syndrome, i.e. by knowing a position of the syndrome bit in the syndrome and/or of a first bit of the syndrome bit group, a relationship, preferably a distance, between the syndrome bit and the syndrome bit group, and information on a number of rows and/or columns of a submatrix of the check matrix may be used to obtain, directly as a calculating result, the position in which the bit error has occurred, for example by applying a simple equation with an addition and a multiplication. This is particularly a result of favourably designing the check matrix.

BRIEF DESCRIPTION OF THE DRAWINGS

Preferred embodiments of the present invention will be explained in more detail below with respect to the accompanying drawings, in which:

FIG. 2 shows a first embodiment of an inventive check matrix; and

FIG. 3 shows a second embodiment of an inventive check matrix.

DESCRIPTION OF THE PREFERRED EMBODIMENTS

Figure 1:
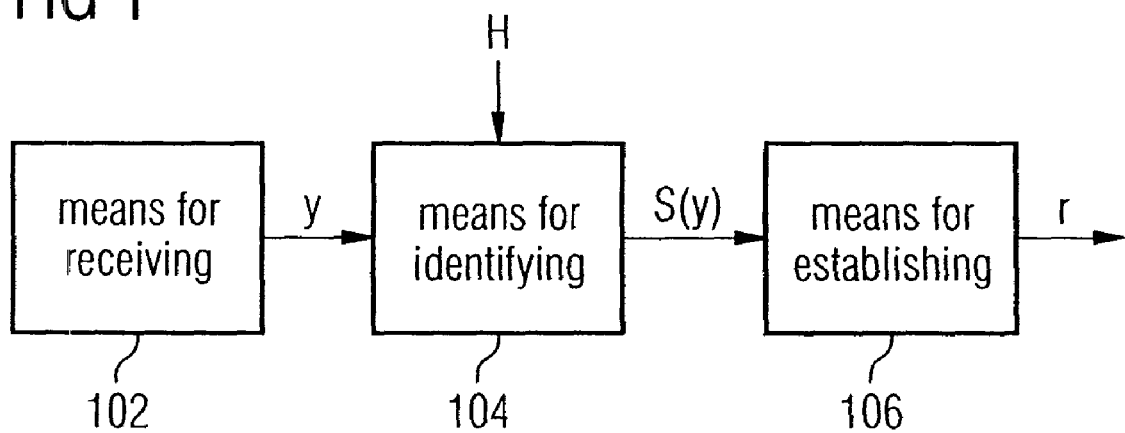
FIG. 1 is a block circuit diagram of an embodiment of the inventive device for determining a position of a bit error.

In the following, equal or similar elements will be provided with equal or similar reference numerals, a repeated description of these elements being omitted.

FIG. 1 shows a block circuit diagram of an embodiment of the inventive device for determining a position of a bit error in a bit sequence. The device includes means 102 for receiving a bit sequence, means 104 for identifying a syndrome S(y) and means 106 for establishing a position of a bit error in a received bit sequence. The means 102 for receiving a bit sequence may receive a bit sequence y either from a message channel or from a memory and supply this bit sequence y to the means 104 for identifying a syndrome S(y). The means 104 for identifying may identify the syndrome S(y) using the bit sequence y received from the means 102 for receiving and the check matrix H. From this syndrome S(y), the means 106 for establishing may subsequently identify the position of the bit error by merely evaluating the syndrome S(y) correspondingly, as will be described in more detail below. As the result, the means 106 for establishing may then output a position r indicating the position in the bit sequence y that is erroneous.

Regarding the structure of the check matrices, it is to be noted that, for a single bit error correction capability, it is necessary that columns (or rows) in the check matrix are different in pairs. For the error correction, the so-called syndrome vector (or briefly the syndrome) is calculated from the bit vector received or to be checked with the help of the check matrix. If the syndrome contains only zeroes, no error has occurred. If the syndrome is identical to a column of the check matrix, exactly one error has occurred. The position of the column of the check matrix identical to the syndrome vector is also the position of the occurred single bit error. For the error correction, there should then first be established whether the obtained syndrome is identical to a column of the check matrix, and if so, secondly the position of this column should be found. This approach known per se can then be extended according to the invention so that, in the suggested family of linear codes correcting single bit errors, the columns of the check matrix or the parity check matrix are placed in a special way. Here, the parity check matrix is divided into square submatrices by combining a corresponding number of columns of H. The resulting square submatrices are circulant (or cyclic).

A circulant matrix of the order n is a square n×n matrix completely determined by its first row (or its first column). In each subsequent row, the elements are shifted one position to the right, wherein, when reaching an end of the matrix, a break is done such that the first elements in that row are filled by the shifted values. One example of a circulant matrix is given in the following:

$$Z = \begin{pmatrix} abcde \\ eabcd \\ deabc \\ cdeab \\ bcdea \end{pmatrix}$$

wherein this matrix is a circulant matrix of the order 5.

Every code of the suggested family of codes is defined by an (n−k)×n parity check matrix H whose columns all contain exactly three ones, with the exception of the last n−k columns which contain only one 1. Be reminded once more that the parity check matrix H has the form H=(A, $I_{n-k}$), wherein A is an (n−k)×k matrix and $I_{n-k}$ is the (n−k)×(n−k) unit matrix.

In other words, the first k columns of H have a Hamming weight of 3, the remaining n−k columns have a Hamming weight of 1. The columns should be unique, i.e. the same column should not occur twice in H.

Codes of this type are known as Hsiao codes in reference documents [M. Y. Hsiao: A Class of Optimal Minimum Odd-weight-column SEC-DED Codes, IBM J. Res. Dev. 14, 395-401 (1970); C. L. Chen, M. Y., Hsiao: Error-Correcting Codes for Semiconductor memory Applications: A State-of-the Art Review, IBM J. Res. Dev. 28, 124-134 (1984).

The fact that the columns of the parity check matrix are unique and have a Hamming weight of 1 or 3 already guarantees that the smallest number of columns adding up to 0 is 4, i.e. the code has a minimum distance of 4. Consequently, the code can correct any single bit error.

In one embodiment of the present invention, not only unique columns with the Hamming distance 3 are used as columns in the parity check matrix, but also (i) columns whose bits meet a simple pattern, and wherein (ii) the placement of columns is performed in a canonical order.

These measures facilitate the process of (i) detecting whether or not a single bit error has occurred, and of (ii) determining the position in which the error has occurred.

Figure 2:
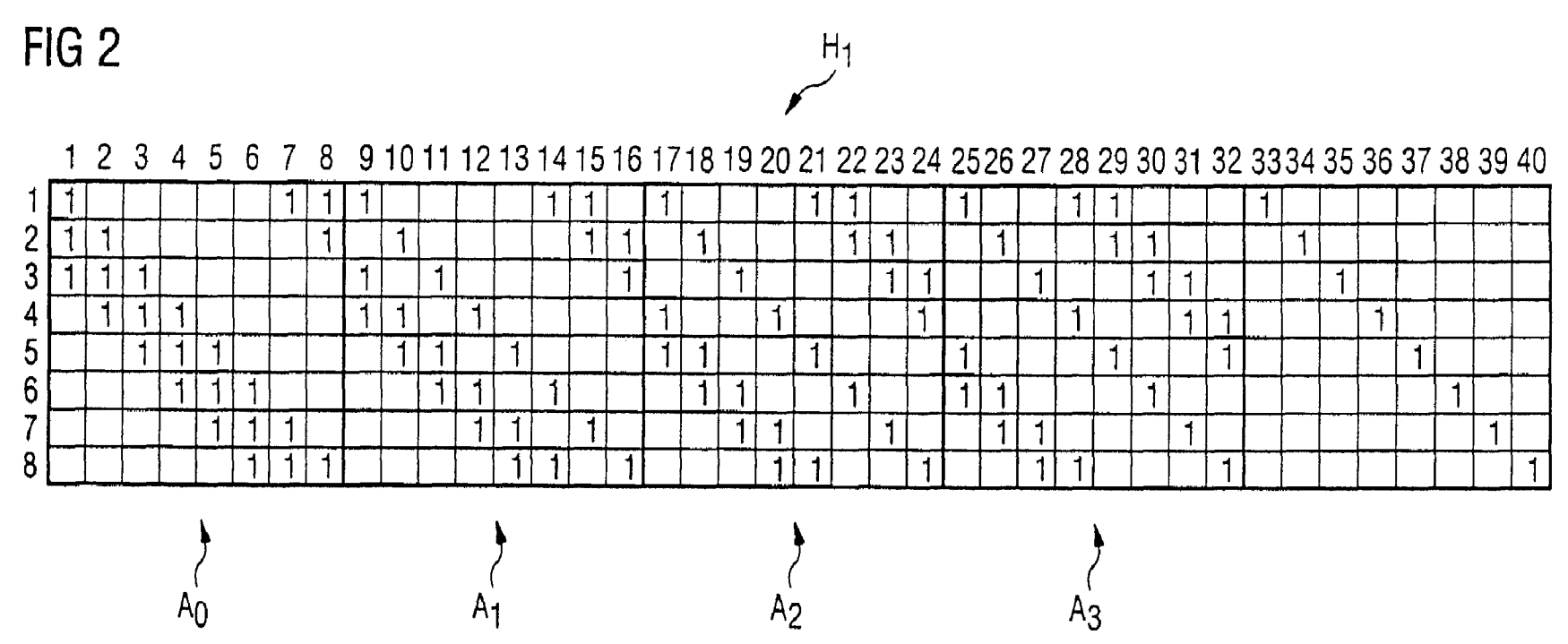

As an example, consider the parity check matrix which is illustrated in FIG. 2 and which is a 8×40 matrix. The matrix $H_1$ defines a linear (40, 32, 4) code. The length of each code word is 40, the message block has the length 32, and the code has a minimum distance of 4.

The first eight columns of $H_1$ form a circulant 8×8 matrix $A_0$. All columns of $A_0$ have in common that they have three successive ones. Each column is considered circularly, i.e., for example, column 7 also has three successive ones. The successor of the two ones at the end is the one appearing in the first row.

The columns 9 to 16 form another 8×8 matrix, i.e. $A_1$. All columns of $A_1$ have in common that they contain an isolated one followed by a zero, followed in turn by two successive ones.

The columns 17 to 24 form another circulant matrix $A_2$. The columns of $A_2$ have in common that an isolated one is followed by two zeroes, followed in turn by two successive ones.

The columns 25 to 32 form a circulant matrix $A_3$ whose columns have in common that an isolated one is followed by three zeroes, followed in turn by two ones.

Columns 33 to 40 form the unit matrix. Each column contains a single one and seven zeroes.

A 40 bit tuple v is further assumed to be given. The syndrome $S(v)=H_1v^T$ is subsequently calculated. If $S(v)=0$, one may conclude that no error has occurred. Assume that the result is a syndrome of the form $$S(v) = \begin{pmatrix} 0 \\ 0 \\ 1 \\ 0 \\ 1 \\ 1 \\ 0 \\ 0 \end{pmatrix}$$

In this case, it may directly be seen that the syndrome vector fulfills the rule used to form the columns of the parity check matrix. The isolated one is followed by a zero, which allows to conclude that the column vector $S(v)$ appears in the submatrix $A_1$. The isolated one appears in row 3, which allows to conclude that $S(v)$ is the third column of $A_1$. The result is that the column vector $S(v)$ is identical to the column number $$1 \cdot 8 + 3 = 11$$

of the parity check matrix $H_1$. This means that the eleventh bit of v is defective and should be corrected.

Generally, the error detection rule reads as follows: if the syndrome has a form in which there is an isolated one in row j (with $1 \leq j \leq 8$) followed by k zeroes (with $0 < k < 3$), followed in turn by two successive ones, and all other positions have zeroes, then the error position r may be calculated by $$r = k \cdot 8 + j$$

If the syndrome is a vector having only a single one in row j, then the error position r is given by $$r = 32 + j$$

The basic idea of the present invention is thus that a preferably used error position formula may simply be implemented in hardware by a correspondingly simple logic. This should allow a simple hardware implementation to calculate the syndrome and (in the case of a single bit error) the correction of these errors within one CPU cycle.

Further examples may be given with respect to the parity check matrix $H_1$ in FIG. 2.

For example, consider the 40 bit tuple x=00011000 10000001 01100100 01010000 10111010.

The corresponding syndrome is calculated as $$H_1 x^T = S(x) = \begin{pmatrix} 0 \\ 0 \\ 0 \\ 0 \\ 0 \\ 0 \\ 0 \\ 0 \end{pmatrix}$$

The resulting conclusion is that no error has occurred.

Furthermore, consider the 40 bit tuple y=00011000 10000001 01000100 01010000 10111010 as an example. The corresponding syndrome is calculated as $$H_1 y^T = S(y) = \begin{pmatrix} 0 \\ 0 \\ 1 \\ 0 \\ 0 \\ 0 \\ 1 \\ 1 \\ 0 \end{pmatrix}.$$

The syndrome has the "right" form: the error position is $r=2\cdot8+3=19$. The bit 19 in y is defective. The corrected 40 bit tuple is therefore c=00011000 10000001 01100 100 01010000 10111010.

Furthermore, the 40 bit tuple z=00011000 10100001 0110010000010000 10111010 may be considered as an example. The corresponding syndrome is calculated as $$H_1 z^T = S(z) = \begin{pmatrix} 0 \\ 1 \\ 1 \\ 0 \\ 1 \\ 0 \\ 1 \\ 0 \end{pmatrix}$$

The syndrome has a Hamming weight of 4, which means that more than only one bit is defective.

Furthermore, the 40 bit tuple w=00000000 01000000 01000000 01000000 11000000 may be considered as an example. The corresponding syndrome is calculated as $$H_1 w^T = S(w) = \begin{pmatrix} 1 \\ 0 \\ 0 \\ 1 \\ 1 \\ 0 \\ 0 \\ 1 \\ 0 \end{pmatrix}$$

Although the syndrome has a Hamming weight of 3, it does not have the required form of an isolated one followed by 0, 1, 2 or three zeroes, followed in turn by two successive ones and otherwise there being only zeroes in the syndrome. This means that a multi bit error has occurred.

As a second application example, consider the check matrix (or the parity check matrix) $H_2$ in FIG. 3. The check matrix (parity check matrix) illustrated there defines a linear (40, 30, 4) code. The code length is 40, the message length is 30, and the minimum distance is 4. The matrix $H_2$ has 10 rows and 40 columns. The last 10 columns define the unit matrix. The first 30 columns each contain three ones. All 30 columns have the following in common: they include the subsequence 101 (the columns are always to be read from top to bottom and are cyclic, i.e. the successor of the tenth column entry is the first column entry). The subsequence 101 is followed either by one or two or three zeroes, then comes the third one. In the columns in the first block, i.e. the columns 1 to 10, 101 is followed by a zero. In the columns of the second block, the columns 11 to 20, the sequence 101 is followed by two zeroes. In the columns of the third block, i.e. the columns 21 to 30, 101 is followed by three zeroes. If j is the position of the first one of the sequence 101 ($1 \leq j \leq 10$) and k is the number of zeroes between 101 and the third one (wherein k=1, 2, 3), then the position r of the column results from the formula $r=(k-1)\cdot 10+j$ If a column contains only one 1 and same is in the $j^{th}$ row, then the position of this column in $H_2$ is given by $r=30+j$.

For example, it may be assumed that, for a vector v to be checked, the result is the syndrome $$S(v) = \begin{pmatrix} 0 \\ 0 \\ 1 \\ 0 \\ 1 \\ 0 \\ 0 \\ 1 \\ 0 \\ 0 \end{pmatrix}$$

In this case, j=3 and k=2. The result is r=10+3=13. The syndrome is identical to the $13^{th}$ column of the matrix $H_2$. In other words, this means that the $13^{th}$ bit of v is defective.

Furthermore, it may be assumed that the syndrome equals $$S(v) = \begin{pmatrix} 0 \\ 0 \\ 0 \\ 1 \\ 0 \\ 0 \\ 0 \\ 1 \\ 0 \\ 1 \end{pmatrix}$$

Here, j=8 and k=3, wherefrom results a position of r=20+8=28 as position for the defective bit.

Furthermore, it may be assumed that the syndrome yields a value of $$S(v) = \begin{pmatrix} 0 \\ 0 \\ 0 \\ 0 \\ 0 \\ 0 \\ 1 \\ 0 \\ 0 \\ 0 \end{pmatrix}$$

Here, j=7 and the error position r=30+j=37. The syndrome is identical to the $37^{th}$ column of the matrix $H_2$.

Alternatively, rows and columns of the check matrix may also be interchanged and the syndrome may be considered as row vector, whereby this requires an analogous adaptation of the respective calculating rules (interchange of rows and columns and correspondingly adapted matrix multiplication operations) to be able to manage the corresponding single bit error correction.

Depending on the circumstances, the inventive methods may be implemented in hardware or in software. The implementation can be done on a digital storage medium, particularly a floppy disk or CD with control signals that may be read out electronically, which may cooperate with a programmable computer system so that the corresponding method is executed. Generally, the invention thus also consists in a computer program product with a program code stored on a machine-readable carrier for performing the inventive method, when the computer program product runs on a computer. In other words, the invention may thus be realized as a computer program with a program code for performing the method, when the computer program runs on a computer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A device for determining a position of a bit error in a bit sequence using a check matrix, wherein the check matrix comprises a predefined number of rows and a predefined number of columns, wherein the check matrix includes a plurality of square submatrices having a submatrix row number and a submatrix column number, wherein the submatrix row number corresponds to the predefined number of rows or the submatrix column number corresponds to the predefined number of columns of the check matrix, wherein each submatrix includes submatrix entries arranged circulantly with respect to a first submatrix row or a first submatrix column, wherein a bit and a bit group are arranged in each submatrix row or in each submatrix column, and wherein, in a first submatrix, the bit and the bit group are arranged in a first predetermined relationship to each other and, in a second submatrix, the bit and the bit group are arranged in a second predetermined relationship to each other, wherein the first predetermined relationship differs from the second predetermined relationship, and wherein the device for determining comprises:
a unit configured to receive a bit sequence;
a unit configured to identify a syndrome using the check matrix and the received bit sequence; and
a unit configured to establish a position of a bit error in the received bit sequence, wherein the unit configured to establish is further configured to identify a syndrome bit and a syndrome bit group in the syndrome, and wherein the unit configured to establish is further configured to determine the position of the bit error of the received bit sequence using information on a position of the syndrome bit or the syndrome bit group in the syndrome, information on a relationship between the syndrome bit and the syndrome bit group and the submatrix row number or the submatrix column number.

2. The device of claim 1, wherein the unit configured to establish is further configured to identify the syndrome bit group such that the syndrome bit group corresponds to the bit group in a submatrix row or to a bit group in a submatrix column.

3. The device for determining of claim 1, further comprising:
a unit configured to correct a bit error at the determined position in the received bit sequence.

4. The device of claim 1, wherein the unit configured to establish is further configured to establish, using the syndrome, whether a plurality of bit errors have occurred in the bit sequence.

5. The device of claim 1, wherein the first and the second predetermined relationship of the bit to the bit group consists of a distance between the bit and the bit group, wherein the unit configured to establish is further configured to determine a distance between the syndrome bit and the syndrome bit group in the syndrome for obtaining the information on the relationship between the syndrome bit and the syndrome bit group.

6. The device of claim 5, wherein the bit in each of the submatrices is arranged in the main diagonal, wherein the unit configured to establish is further configured to determine, as position r of an occurred bit error, the position resulting from the application of the formula $$r = k \cdot 1 + j \qquad 3$$

wherein k is a variable referring to the distance between the syndrome bit and the syndrome bit group, wherein l is a variable referring to the submatrix row number or the submatrix column number of a submatrix, and wherein j is a variable referring to a distance of the syndrome bit from a first bit of the syndrome.

7. The device of claim 5, wherein a bit of the bit group is arranged in the main diagonal in each of the submatrices, wherein the unit configured to establish is further configured to determine, as position of an occurred bit error, the position r resulting from the application of the formula $$r = (k-1) \cdot 1 + j$$

wherein k is a variable referring to a distance between the syndrome bit and the syndrome bit group, wherein l is a variable referring to the submatrix row number or the submatrix column number of a submatrix, and wherein j is a variable referring to a distance between a first bit of the syndrome bit group and the syndrome beginning.

8. A method for determining a position of a bit error in a bit sequence using a check matrix, wherein the check matrix comprises a predefined number of rows and a predefined number of columns, wherein the check matrix includes a plurality of square submatrices having a submatrix row number and a submatrix column number, wherein the submatrix row number corresponds to the predefined number of rows or the submatrix column number corresponds to the predefined number of columns of the check matrix, wherein each submatrix includes submatrix entries arranged circulantly with respect to a first submatrix row or a first submatrix column, wherein a bit and a bit group are arranged in each submatrix row or in each submatrix column, and wherein, in a first submatrix, the bit and the bit group are arranged in a first predetermined relationship to each other and, in a second submatrix, the bit and the bit group are arranged in a second predetermined relationship to each other, wherein the first predetermined relationship differs from the second predetermined relationship, and wherein the method for determining comprises:
receiving a bit sequence;
identifying a syndrome using the check matrix and the received bit sequence; and
establishing a position of a bit error in the received bit sequence such that a syndrome bit and a syndrome bit group are identified in the syndrome to determine the position of the bit error of the received bit sequence using information on a position of the syndrome bit or the syndrome bit group in the syndrome, information on a relationship between the syndrome bit and the syndrome bit group and the submatrix row number or the submatrix column number.

9. A device for providing a check matrix for identifying a position of a bit error in a bit sequence, comprising:
   a unit configured to determine a first square submatrix, wherein the first square submatrix comprises a bit and a bit group either in each submatrix row or in each submatrix column, wherein the first square submatrix includes submatrix entries arranged circulantly with respect to a first submatrix row or a first submatrix column, and wherein the bit and the bit group are arranged in a first predetermined relationship to each other;
   a unit configured to identify a square second submatrix, wherein the second submatrix comprises a bit and a bit group in each submatrix row or in each submatrix column, wherein the second square submatrix includes submatrix entries arranged circulantly with respect to a first submatrix row or a first submatrix column, and wherein the bit and the bit group are arranged in a second predetermined relationship to each other, wherein the first predetermined relationship differs from the second predetermined relationship; and
   a unit configured to combine the first and the second square submatrix to a check matrix, wherein the check matrix includes a number of rows corresponding to a submatrix row number of the first or the second submatrix, or wherein the check matrix includes a number of columns corresponding to a submatrix column number of the first or the second square submatrix.

10. A method for providing a check matrix for identifying a position of a bit error in a bit sequence, the method comprising:
   determining a first square submatrix such that the first submatrix comprises a bit and a bit group either in each submatrix row or in each submatrix column, wherein the first square submatrix includes submatrix entries arranged circulantly with respect to a first submatrix row or a first submatrix column, and wherein the bit and the bit group are arranged in a first predetermined relationship to each other;
   identifying a square second submatrix such that the second submatrix comprises a bit and a bit group either in each submatrix row or in each submatrix column, wherein the second square submatrix includes submatrix entries arranged circulantly with respect to a first submatrix row or a first submatrix column, and wherein the bit and the bit group are arranged in a second predetermined relationship to each other, wherein the first predetermined relationship differs from the second predetermined relationship; and
   combining the first and the second square submatrix to a check matrix, wherein the check matrix includes a number of rows corresponding to a submatrix row number of the first or the second square submatrix, or wherein the check matrix includes a number of columns corresponding to a submatrix column number of the first or the second square submatrix.

11. A check matrix for determining a position of a bit error in a bit sequence, comprising:
   a first square submatrix comprising a bit and a bit group either in each submatrix row or in each submatrix column, wherein the first square submatrix includes submatrix entries arranged circulantly with respect to a first submatrix row or a first submatrix column, and wherein the bit and the bit group are arranged in a first predetermined relationship to each other; and
   a second square submatrix comprising a bit and a bit group either in each submatrix row or in each submatrix column, wherein the second square submatrix includes submatrix entries arranged circulantly with respect to a first submatrix row or a first submatrix column, and wherein the bit and the bit group are arranged in a second predetermined relationship to each other, wherein the first predetermined relationship differs from the second predetermined relationship,
   wherein the first square submatrix and the second square submatrix are arranged in the check matrix such that the check matrix comprises a number of rows corresponding to a submatrix row number of the first or the second square submatrix, or that the check matrix comprises a number of columns corresponding to a submatrix column number of the first or the second square submatrix.

12. A computer program with program code stored on a machine-readable carrier for performing a method for determining a position of a bit error in a bit sequence using a check matrix, when the computer program runs on a computer, wherein the check matrix comprises a predefined number of rows and a predefined number of columns, wherein the check matrix includes a plurality of square submatrices having a submatrix row number and a submatrix column number, wherein the submatrix row number corresponds to the predefined number of rows or the submatrix column number corresponds to the predefined number of columns of the check matrix, wherein each submatrix includes submatrix entries arranged circulantly with respect to a first submatrix row or a first submatrix column, wherein a bit and a bit group are arranged in each submatrix row or in each submatrix column, and wherein, in a first submatrix, the bit and the bit group are arranged in a first predetermined relationship to each other and, in a second submatrix, the bit and the bit group are arranged in a second predetermined relationship to each other, wherein the first predetermined relationship differs from the second predetermined relationship, and wherein the method for determining comprises receiving a bit sequence;
   identifying a syndrome using the check matrix and the received bit sequence; and establishing a position of a bit error in the received bit sequence such that a syndrome bit and a syndrome bit group are identified in the syndrome to determine the position of the bit error of the received bit sequence using information on a position of the syndrome bit or the syndrome bit group in the syndrome, information on a relationship between the syndrome bit and the syndrome bit group and the submatrix row number or the submatrix column number.

13. A computer program with program code stored on a machine-readable carrier for performing a method for providing a check matrix for identifying a position of a bit error in a bit sequence, when the computer program runs on a computer, the method comprising:
   determining a first square submatrix such that the first square submatrix comprises a bit and a bit group either in each submatrix row or in each submatrix column, wherein the first square submatrix includes submatrix entries arranged circulantly with respect to a first submatrix row or a first submatrix column, and wherein the bit and the bit group are arranged in a first predetermined relationship to each other; identifying a square second submatrix such that the second square submatrix comprises a bit and a bit group either in each submatrix row or in each submatrix column, wherein the second square submatrix includes submatrix entries arranged circulantly with respect to a first submatrix row or a first submatrix column, and wherein the bit and the bit group are arranged in a second predetermined relationship to each other, wherein the first predetermined relationship differs from the second predetermined relationship; and combining the first and the second square submatrix to a check matrix, wherein the check matrix includes a number of rows corresponding to a submatrix row number of the first or the second square submatrix, or wherein the check matrix includes a number of columns corresponding to a submatrix column number of the first or the second square submatrix.

* * * * *